US012584959B2

(12) United States Patent
Chen et al.

(10) Patent No.: US 12,584,959 B2
(45) Date of Patent: Mar. 24, 2026

(54) SIGNAL PROCESSING METHOD AND ABNORMAL SOUND DETECTION SYSTEM

(71) Applicant: GlobalWafers Co., Ltd., Hsinchu (TW)

(72) Inventors: Yue-Dong Chen, Hsinchu (TW); You-Siang Chen, Hsinchu (TW); Chun-Yu Chang, Hsinchu (TW); Mingsian Bai, Hsinchu (TW); Yu-Lun Deng, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 260 days.

(21) Appl. No.: 18/465,976

(22) Filed: Sep. 12, 2023

(65) Prior Publication Data

US 2024/0151768 A1      May 9, 2024

(30) Foreign Application Priority Data

Nov. 8, 2022      (TW) .................................. 111142564

(51) Int. Cl.
*G01R 31/28*          (2006.01)
*H04B 11/00*          (2006.01)
*H04B 17/23*          (2015.01)

(52) U.S. Cl.
CPC ......... *G01R 31/2881* (2013.01); *H04B 11/00* (2013.01); *H04B 17/23* (2015.01)

(58) Field of Classification Search
None
See application file for complete search history.

(56) References Cited

U.S. PATENT DOCUMENTS

| | | | | |
|---|---|---|---|---|
| 11,449,977 B2 * | 9/2022 | Steiman | ................ | G06T 7/0004 |
| 11,920,807 B2 * | 3/2024 | Song | ........................ | F24F 11/64 |
| 2019/0297381 A1 * | 9/2019 | Chung | ................... | G06N 20/10 |
| 2021/0174817 A1 * | 6/2021 | Grauman | ................ | G10L 25/51 |
| 2021/0406688 A1 * | 12/2021 | Ok | ........................ | G06V 10/774 |
| 2022/0036538 A1 * | 2/2022 | Steiman | ................... | G06T 7/10 |
| 2022/0101112 A1 | 3/2022 | Brown et al. | | |
| 2022/0316731 A1 * | 10/2022 | Song | ........................ | F24F 11/63 |

FOREIGN PATENT DOCUMENTS

| | | | | |
|---|---|---|---|---|
| CN | 111215387 | 6/2020 | | |
| CN | 113358695 A | * 9/2021 | ............. | G06N 3/045 |
| TW | 202124982 | 7/2021 | | |
| TW | 202146128 | 12/2021 | | |
| TW | 202202957 | 1/2022 | | |
| TW | 202221536 | 6/2022 | | |

* cited by examiner

*Primary Examiner* — Jermele M Hollington
(74) *Attorney, Agent, or Firm* — JCIPRNET

(57) ABSTRACT

Disclosed are a signal processing method and an abnormal sound detection system. First, a neural network model is trained, including: (a) randomly selecting a plurality of sample signals from a training database to obtain a combined signal, wherein the training database includes the first sample set belonging to the first classification label and the second sample set belonging to the second classification label, and the number of selected sample signals conforms to the preset number; repeating the said step to obtain a plurality of combined signals and using the combined signals to train the neural network model. Then, a sound signal received from a sound receiving apparatus is inputted to the trained neural network model to output a probability value, and a corresponding notification signal is outputted based on the probability value.

20 Claims, 8 Drawing Sheets

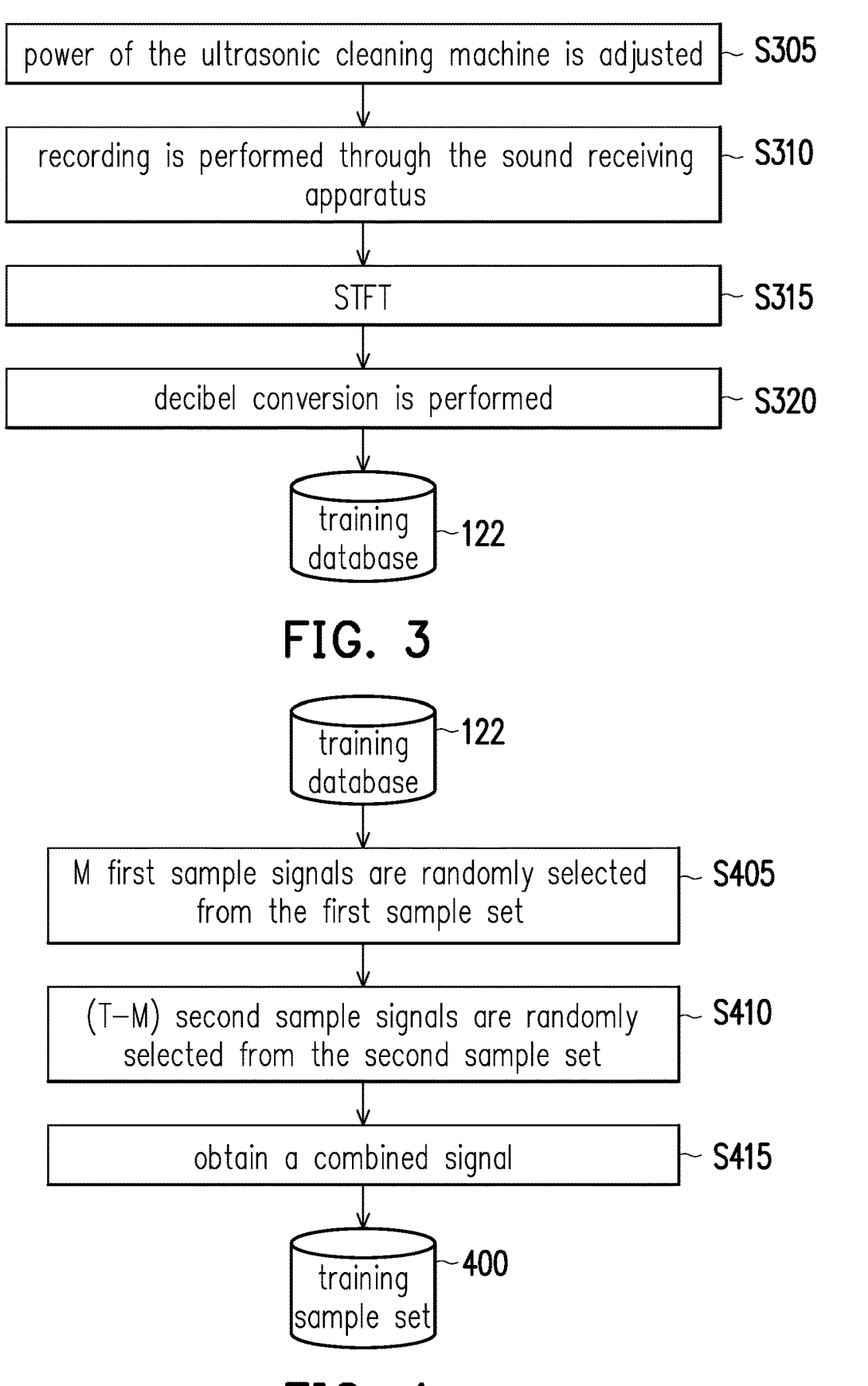

power of the ultrasonic cleaning machine is adjusted ⎤⁓ S305 recording is performed through the sound receiving apparatus ⎤⁓ S310

STFT ⎤⁓ S315 decibel conversion is performed ⎤⁓ S320 training database ⁓122

FIG. 3 training database ⁓122

M first sample signals are randomly selected from the first sample set ⎤⁓ S405

(T−M) second sample signals are randomly selected from the second sample set ⎤⁓ S410 obtain a combined signal ⎤⁓ S415 training sample set ⁓400

FIG. 4

SIGNAL PROCESSING METHOD AND ABNORMAL SOUND DETECTION SYSTEM

CROSS-REFERENCE TO RELATED APPLICATION

This application claims the priority benefit of Taiwan application serial no. 111142564, filed on Nov. 8, 2022. The entirety of the above-mentioned patent application is hereby incorporated by reference herein and made a part of this specification.

BACKGROUND

Technical Field

The present disclosure relates to a signal processing mechanism, and in particular to a signal processing method and an abnormal sound detection system.

Description of Related Art

Currently, ultrasonic/megasonic cleaning processes are adopted in semiconductor cleaning processes. However, in order to avoid the abnormal state of the wafer during the cleaning process from causing abnormality in the subsequent process, the sound pressure meter is generally adopted for carrying out detection in the ultrasonic cleaning machine. The measurement of the sound pressure meter is an offline system and has no early warning effect, so the sound pressure meter cannot be monitored in real time. In addition, the measurement of the sound pressure meter must be carried out manually, accordingly conventional detection method is also quite time-consuming.

SUMMARY

The present disclosure provides a signal processing method and an abnormal sound detection system, which are able to monitor and warn the abnormality of the device under test in real time.

The signal processing method of the present disclosure is executable by a processor, and the method includes: training a neural network model, the neural network model includes an input layer, a first hidden layer, a second hidden layer and an output layer, and the first hidden layer, the second hidden layer and the output layer respectively have individual activation functions; receiving the sound signal from the sound receiving apparatus; inputting the sound signal into the trained neural network model to output the probability value; and outputting the corresponding notification signal based on the probability value. Training the neural network model includes: (a) randomly selecting a plurality of sample signals from a training database to obtain a combined signal, and the training database includes the first sample set belonging to the first classification label and the second sample set belonging to the second classification label, and the number of selected sample signals conforms to a preset number; (b) repeating the step (a) for a plurality of times to obtain a plurality of combined signals and (c) using the combined signals to train the neural network model.

The abnormal sound detection system of the present disclosure includes: a sound receiving apparatus, which is arranged below the device under test for receiving sound; and an electronic device. The electronic device includes: a receiving port, configured to receive a sound signal from the sound receiving apparatus; a storage device, storing a training database and a neural network model; and a processor, coupled to the receiving port and the storage device, and configured to: train the neural network model, the neural network model includes an input layer, a first hidden layer, a second hidden layer, and an output layer, and the first hidden layer, the second hidden layer, and the output layer have individual activation functions respectively; receive a sound signal; input the sound signal into the trained neural network model to output the probability value; and output the corresponding notification signal based on the probability value. Training the neural network model includes: (a) randomly selecting a plurality of sample signals from a training database to obtain a combined signal, and the training database includes the first sample set belonging to the first classification label and the second sample set belonging to the second classification label, and the number of selected sample signals conforms to a preset number; (b) repeating the step (a) for a plurality of times to obtain a plurality of combined signals and (c) using the combined signals to train the neural network model.

Based on the above, the disclosure uses the neural network model to not only monitor the device under test in real time, but also solve the time-consuming issue of manual detection in conventional technology.

BRIEF DESCRIPTION OF THE DRAWINGS

FIG. 3 is a flowchart of generating a training database according to an embodiment of the present disclosure.

FIG. 4 is a flowchart of obtaining combined signals according to an embodiment of the present disclosure.

DESCRIPTION OF THE EMBODIMENTS

Figure 1:
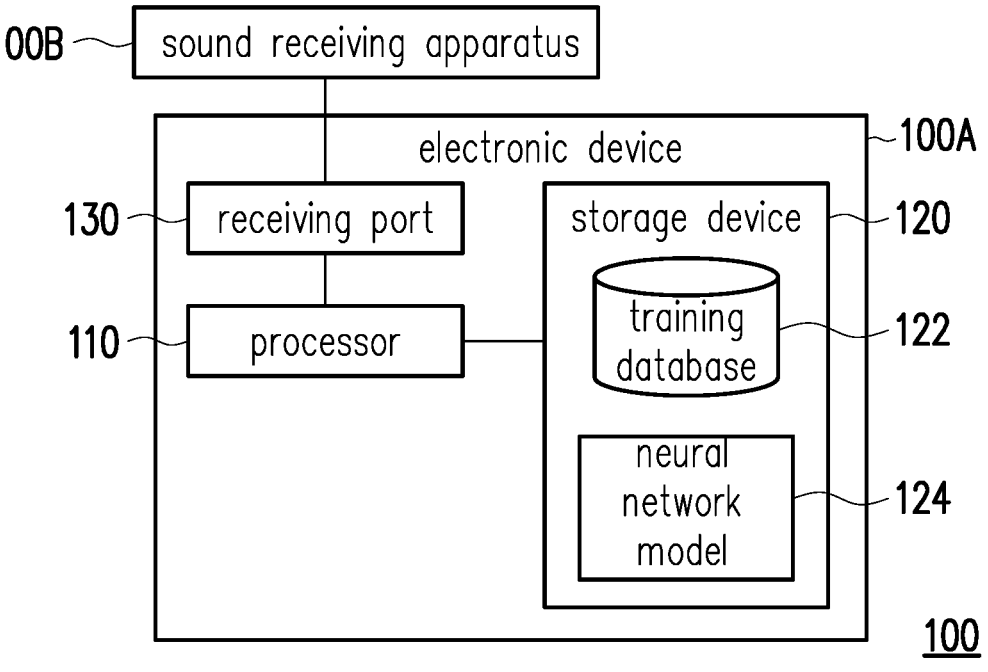
FIG. 1 is a block diagram of an abnormal sound detection system according to an embodiment of the present disclosure.

FIG. 1 is a block diagram of an abnormal sound detection system according to an embodiment of the present disclosure. Please refer to FIG. 1, the abnormal sound detection system 100 includes an electronic device 100A and a sound receiving apparatus 100B. The sound receiving apparatus 100B is, for example, a microphone. The sound receiving apparatus 100B is arranged below the device under test to receive sound and transmit the received sound signal to the electronic device 100A.

The electronic device 100A includes a processor 110, a storage device 120 and a receiving port 130. The processor 110 is coupled to the storage device 120 and the receiving port 130.

The receiving port 130 is configured to receive a sound signal from the sound receiving apparatus 100B. The storage device 120 stores a training database 122 and a neural network model 124. The processor 110 is configured to train the neural network model 124 based on the training database 122, and then determine whether the sound signal is abnormal through the trained neural network model 124. For example, it is determined whether there is an abnormal sound in the sound signal, or the trained neural network model 124 is used to determine whether the device under test is activated or not activated based on the sound signal.

The processor 110 is, for example, a central processing unit (CPU), a physical processing unit (PPU), a programmable microprocessor, an embedded control chip, a digital signal processor (DSP), an application specific integrated circuit (ASIC) or other similar devices.

The storage device 120 is, for example, any type of fixed or removable random access memory (RAM), read-only memory (ROM), a flash memory, a hard disk or other similar devices or a combination of these devices. The storage device 120 includes one or more code segments, which are executed by the processor 110 after being installed.

The receiving port 130 is, for example, a universal serial bus (USB) port, a general purpose interface bus (GPIB) port, or a local area network (LAN) port, etc.

Figure 2:
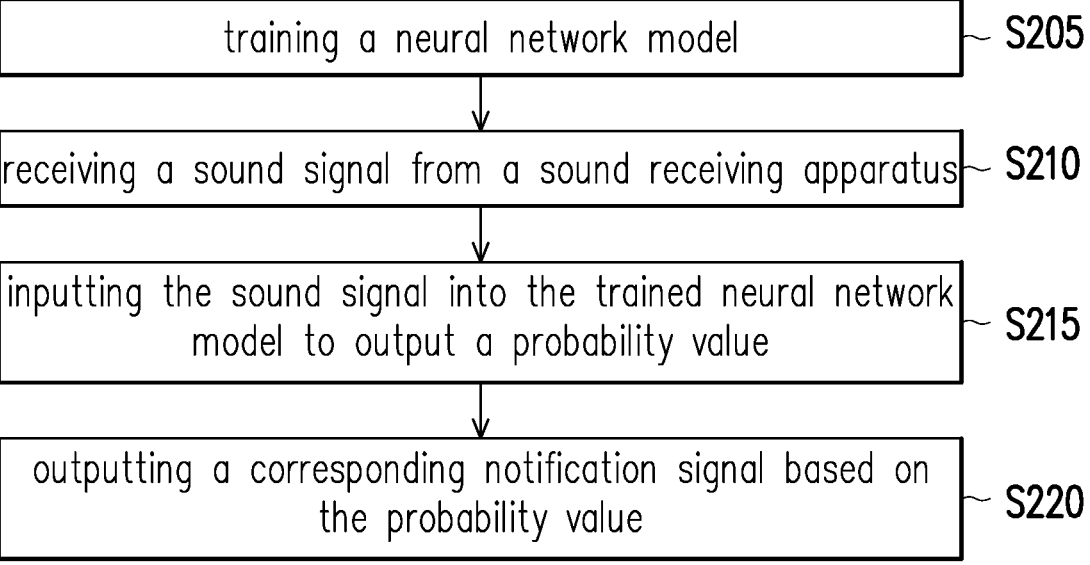
FIG. 2 is a flowchart of a signal processing method according to an embodiment of the present disclosure.

FIG. 2 is a flowchart of a signal processing method according to an embodiment of the present disclosure. Please refer to FIG. 1 and FIG. 2 at the same time. In step S205, the neural network model 124 is trained through the processor 110.

The processor 110 randomly selects a plurality of sample signals from the training database 122 to obtain a combined signal. Here, the training database 122 includes a first sample set belonging to the first classification label and a second sample set belonging to the second classification label, and the number of the selected sample signals conforms to the preset number. For example, 100 sample signals are selected to synthesize a combined signal. The processor 110 repeatedly executes the above operations to obtain a plurality of combined signals. Afterwards, the processor 110 uses these combined signals to train the neural network model 124.

In an embodiment, if the neural network model 124 is intended to be used to determine whether the device under test is activated, then during sample collection, the sample audio files collected when the device under test is activated are used as the first sample set, and the first classification label thereof is set to "1" (which denotes the activation state). On the other hand, during sample collection, the sample audio files collected before the device under test is activated are used as the second sample set, and the second classification label thereof is set to "0" (which denotes the off state).

In another embodiment, if the neural network model 124 is intended to be used to determine whether the operation of the device under test is abnormal, then during sample collection, the original audio files collected during the normal operation of the device under test are used as the first sample set, and the first classification label thereof is set to "1" (which denotes the normal state). On the other hand, during sample collection, the original audio files collected when the device under test is operating abnormally are used as a second sample set, and the second classification label thereof is set to "0" (which denotes the abnormal state).

The following FIG. 3 to FIG. 7 illustrate the training process of the neural network model 124.

FIG. 3 is a flowchart of generating a training database according to an embodiment of the present disclosure. In this embodiment, an ultrasonic cleaning machine is used as the device under test for illustration, but the disclosure is not limited thereto. Referring to FIG. 3, in step S305, the power of the ultrasonic cleaning machine is adjusted. In an embodiment, personnel may adjust the power of the ultrasonic cleaning machine according to various abnormal or normal operating conditions, and use a sound pressure meter to measure the sound pressure to determine whether the operation of the ultrasonic cleaning machine is normal or abnormal. For example, in an ultrasonic cleaner, a quartz probe (glass rod) may be used to sense the sound pressure in order to make sure whether the sound field intensity in the entire tank is uniform. In addition, it is further set that a case where the sound pressure is within 16 mmV to 24 mmV represents normal operation, and a case where the sound pressure is not within the range represents abnormal operation.

After confirming the current state of the ultrasonic cleaning machine (normal operation or abnormal operation), in step S310, the ultrasonic cleaning machine is recorded through the sound receiving apparatus 100B to obtain the original audio file (for training). The recorded original audio file will set the corresponding classification label according to the state of the ultrasonic cleaning machine at the time of recording. For example, the original audio files recorded in the normal operation state correspond to the first classification label (set to "1"), and the original audio files recorded in the abnormal operation state correspond to the second classification label (set to "0").

Next, in step S315, the processor 110 performs a short-time Fourier transform (STFT) on the original audio file to obtain a corresponding spectrogram. Afterwards, in step S320, decibel conversion is performed on the spectrogram, and the converted signal is used as a sample signal, and the sample signal is stored in the training database 122. Multiple sample signals may be obtained by repeatedly performing the above steps S305 to S320.

In other embodiments, after obtaining a plurality of original audio files, STFT may be performed on these original audio files to obtain a plurality of spectrograms, and then decibel conversion is performed on these spectrograms to obtain a plurality of sample signals. Afterwards, the sample signals are divided into a first sample set belonging to the first classification label and a second sample set belonging to the second classification label according to the classification label. That is, the sample signals corresponding to the first classification label are classified into the first sample set, and the sample signals corresponding to the second classification label are classified into the second sample set.

Figure 5:
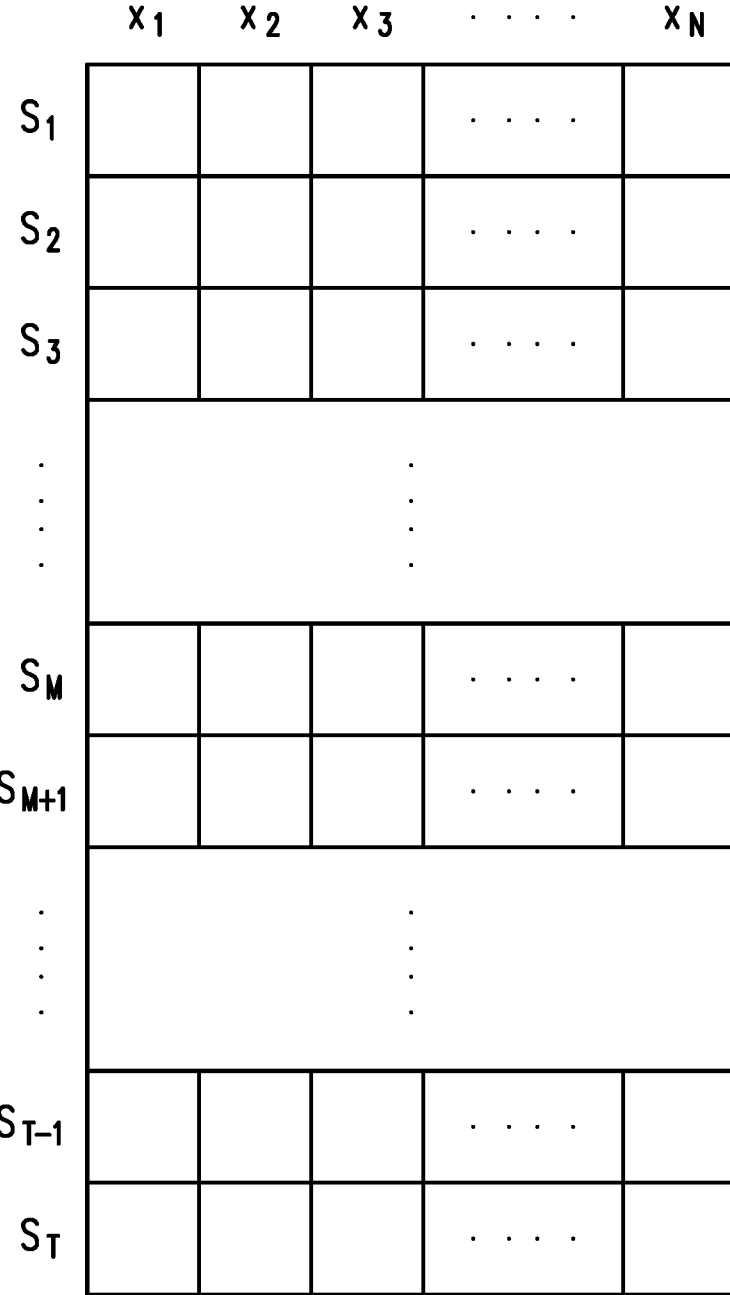
FIG. 5 is a schematic diagram of combined signals according to an embodiment of the present disclosure.

Afterwards, as shown in FIG. 4, the training sample set 400 is obtained from the training database 122. FIG. 4 is a flowchart of obtaining combined signals according to an embodiment of the present disclosure. FIG. 5 is a schematic diagram of combined signals according to an embodiment of the present disclosure. Please refer to FIG. 4 and FIG. 5, in step S405, M first sample signals are randomly selected from the first sample set, such as the first sample signals $S_1$ to $S_M$ shown in FIG. 5. Here, $0 \leq M \leq T$, T represents the preset number (fixed number of sound frames).

Moreover, in step S410, (T–M) second sample signals are randomly selected from the second sample set, such as the first sample signals $S_{M+1}$ to $S_T$ shown in FIG. 5. Here, the disclosure provides no limitation to execution sequence of step S405 and step S410.

Thereafter, in step S415, M first sample signals and (T–M) second sample signals are combined to obtain a combined signal 500, and the combined signal 500 is stored in the training sample set 400. The above steps S405 to S415 are repeated to obtain multiple combined signals.

Figure 6:
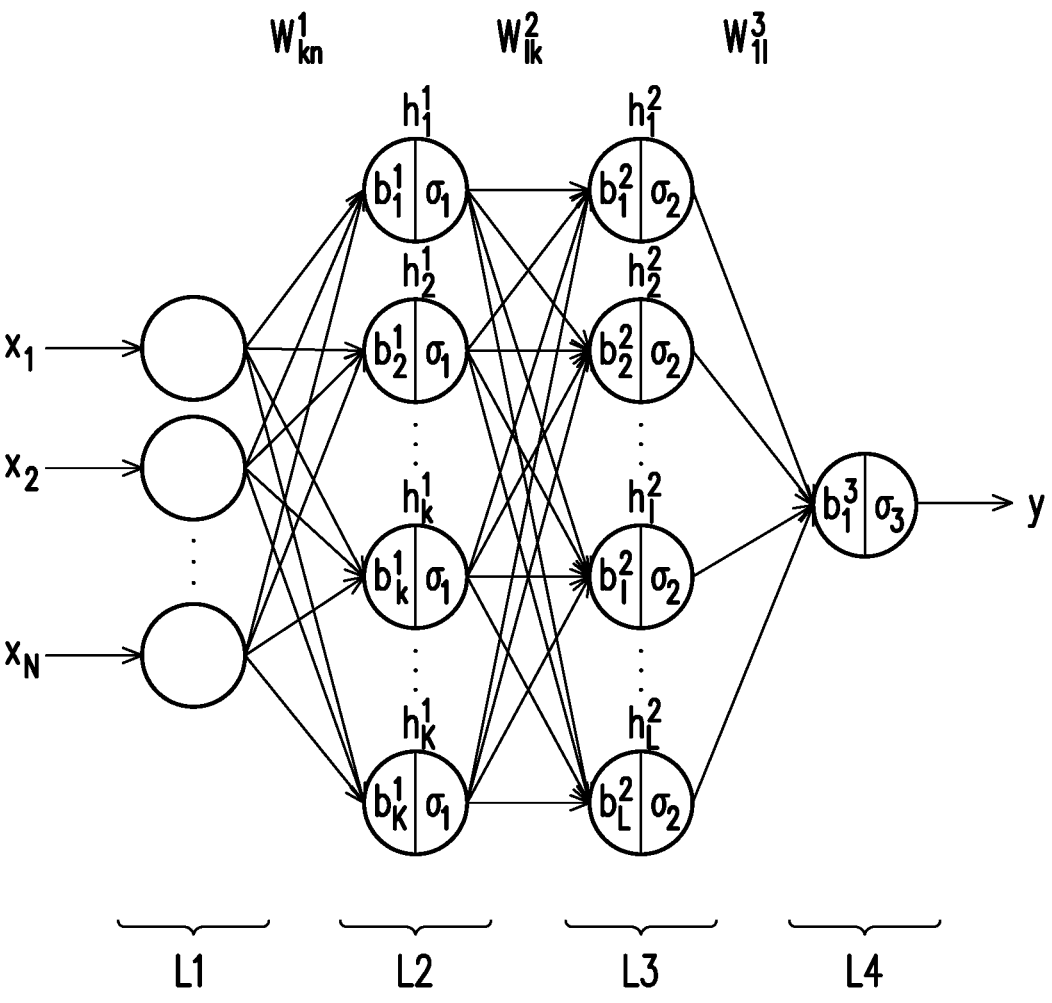
FIG. 6 is a structural diagram of a neural network model according to an embodiment of the present disclosure.

After obtaining a certain number of combined signals, the neural network model 124 may be trained. In an embodiment, each sample signal ($S_1$ to $S_T$) in the combined signal includes N signal blocks $x_1$ to $x_N$. The N signal blocks $x_1$ to $x_N$ are used as the input of the neural network model 124 for training. FIG. 6 is a structural diagram of a neural network model according to an embodiment of the present disclosure. In FIG. 6, the neural network model 124 includes an input layer L1, a first hidden layer L2, a second hidden layer L3 and an output layer L4. The first hidden layer L2, the second hidden layer L3, and the output layer L4 each have separate activation functions. The input layer L1 includes N nodes for receiving N signal blocks $x_1$ to $x_N$ of a sample signal to extract feature parameters from these signal blocks. The first hidden layer L2 includes K nodes. The second hidden layer L3 includes L nodes. The output layer L4 includes 1 node.

The first hidden layer L2 uses the activation function $\sigma 1$, and the deviation values of its K nodes are $$b_1^1 \sim b_K^1$$

respectively, and the output of each node is $$h_k^1 = \sigma_1\left(\sum_n^N W_{kn}^1 x_n + b_k^1\right),$$

where n=1, 2, . . . , N, k=1, 2, . . . , K. For example, in the first hidden layer L2, the output of the first node (k=1) is $$h_1^1 = \sigma_1\left(W_{11}^1 x_1 + W_{12}^1 x_2 + W_{13}^1 x_3 + \ldots + w_{1n}^1 x_n + b_1^1\right),$$

the output of the second node (k=2) is $$h_2^1 = \sigma_1\left(W_{21}^1 x_1 + W_{22}^1 x_2 + W_{23}^1 x_3 + \ldots + w_{2n}^1 x_n + b_2^1\right),$$

and the rest may be deduced from the above.

The second hidden layer L3 uses the activation function $\sigma 2$, and the deviation values of its L nodes are $$b_1^2 \sim b_L^2$$

respectively, and the output of each node is $$h_l^2 = \sigma_2\left(\sum_k^K W_{lk}^2 h_k^1 + b_l^2\right),$$

where l=1, 2, . . . , L, k=1, 2, . . . , K. For example, in the second hidden layer L3, the output of the first node (l=1) is $$h_1^2 = \sigma_2\left(\sum_k^K W_{lk}^2 h_k^1 + b_l^2\right),$$

the output of the second node (l=2) is $$h_2^2 = \sigma_2\left(W_{21}^2 x_1 + W_{22}^2 x_2 + W_{23}^2 x_3 + \ldots + W_{2K}^2 x_n + b_2^2\right),$$

and the rest may be deduced from the above.

The second hidden layer L3 uses the activation function $\sigma 3$, the deviation value of its nodes is $$y = \sigma_3\left(\sum_l^L W_{1l}^3 h_l^2 + b_1^3\right),$$

that is, $$y = \sigma_3\left(W_{11}^3 h_1^2 + w_{12}^3 h_2^2 + W_{13}^3 h_3^2 + \ldots + W_{1L}^3 h_L^2 + b_1^3\right), \text{ where } l = 1, 2, \ldots, L.$$

The $$W\left(W_{kn}^1, W_{lk}^2, W_{1l}^3\right)$$

are weight values, and these weight values may be adjusted through the training process.

Figure 7:
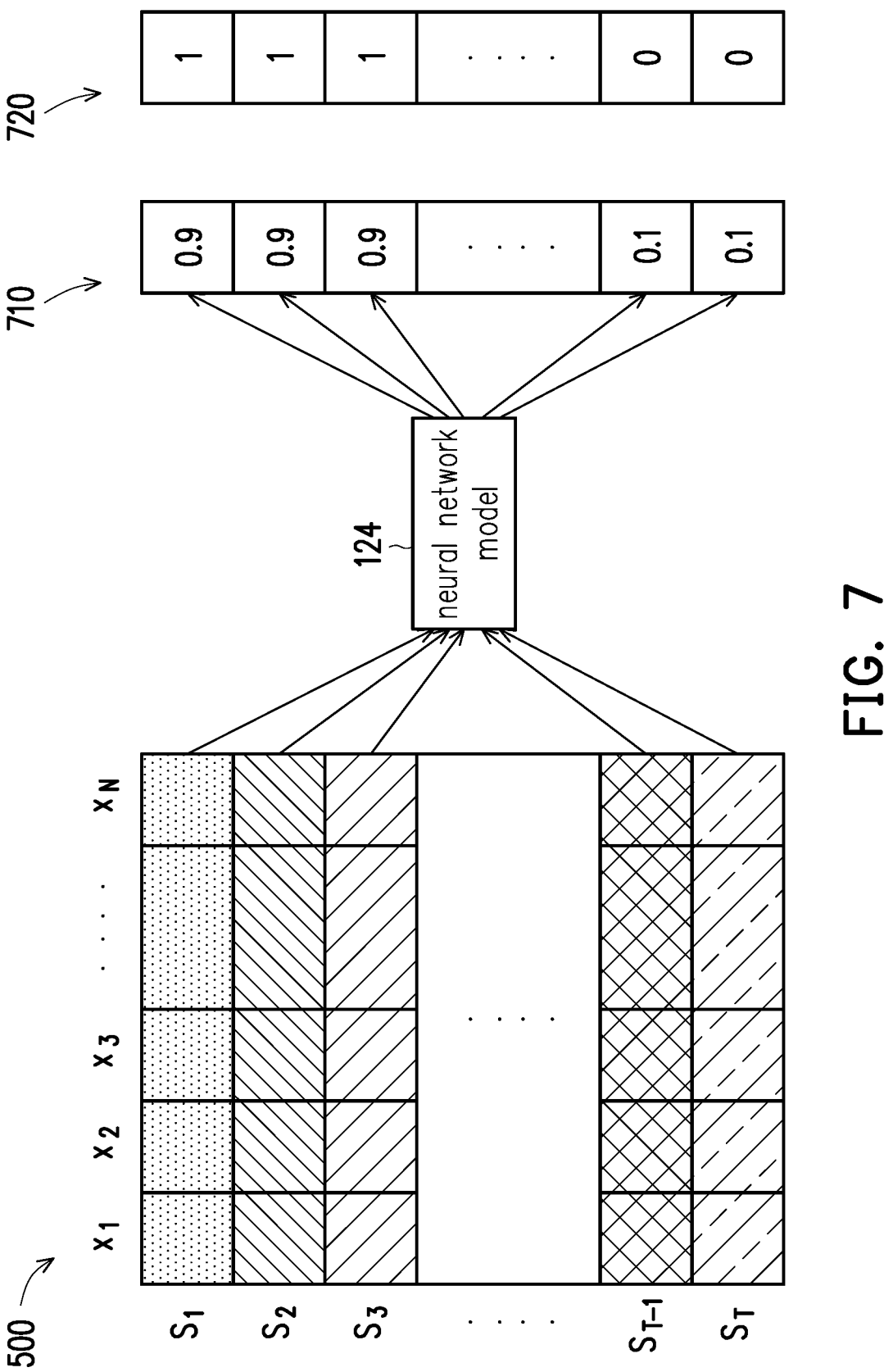
FIG. 7 is a schematic diagram of a training phase of a neural network model according to an embodiment of the present disclosure.

FIG. 7 is a schematic diagram of a training phase of a neural network model according to an embodiment of the present disclosure. Please refer to FIG. 7, the combined signal 500 includes T sample signals $S_1$ to $S_T$. In the training phase, the combined signal 500 composed of T sample signals $S_1$ to $S_T$ is input to the neural network model 124, and the neural network model 124 will output an output result 710 including T output values.

Here, since the neural network model 124 adopts two kinds of classification labels (the first classification label "1", the second classification label "0"), that is, there are only two types of classification problems, so binary cross entropy may be used as the loss function. The loss function is used to evaluate the degree of inconsistency between the output value and the corresponding classification label. After the output result 710 is obtained, the T output values are subjected to binary cross entropy loss function training according to their corresponding classification label results 720.

The formula of binary cross entropy BCE is as follows:

$$BCE(o \cdot t) = -\frac{1}{T}\sum_i^T ((t[i] * \log(o[i])) + (1 - t[i]) * \log(1 - o[i]))$$

where, o is the output value of the neural network model 124, t is the target (for example, the first classification label "1" or the second classification label "0"), and T=100.

In the process of training the neural network model 124, the number of iterations is determined based on the number of combined signals included in the training sample set 400, the batch size and the number of epoches used in each iteration training. Specifically, the number of iterations=

(total number of samples÷batch size)×epoch. The number of epoches represents the number of times that all combined signals need to be trained.

It is assumed that the training sample set 400 includes a total of 1024 combined signals, and it is set that the batch size used for each iteration training is 64 (only 64 combined signals are trained in one iteration), and 1 epoch requires 16 times of iterations.

Returning to FIG. 2, after the training of the neural network model 124 is completed, in step S210, the processor 110 receives a sound signal from the sound receiving apparatus 100B through the receiving port 130. The sound receiving apparatus 100B receives sound from the device under test to obtain a sound signal, and then transmits the sound signal to the electronic device 100A.

In step S215, the processor 110 inputs the sound signal to the trained neural network model 124 to output a probability value. Based on the structure of the above-mentioned neural network model 124, the processor 110 divides the sound signal into a plurality of sub-signals conforming to a preset number (for example, T). Then, these sub-signals are respectively input into the trained neural network model 124 to obtain multiple output values, and then the average of these output values is calculated as the probability value.

For example, the sound signal is divided into T sub-signals $R_1$ to $R_T$, and each of the sub-signals $R_1$ to $R_T$ is divided into N signal blocks $x_1$ to $x_N$. Next, the signal blocks $x_1$ to $x_N$ of the sub-signal $R_1$ are input into the neural network model 124 to obtain an output value 0.9; the signal blocks $x_1$ to $x_N$ of the sub-signal $R_2$ are input into the neural network model 124 to obtain an output value 0.9; . . . ; the signal blocks $x_1$ to $x_N$ of the sub-signal $R_{T-1}$ are input to the neural network model 124 to obtain an output value 0.1; the signal blocks $x_1$ to $x_N$ of the sub-signal $R_T$ are input to the neural network model 124 to obtain an output value 0.1. Next, the average of T output values is calculated as the probability value.

After that, in step S220, the processor 110 outputs a corresponding notification signal based on the probability value. For example, one threshold and two notification signals may be set. If the probability value is greater than the threshold, the first notification signal is output; otherwise, the second notification signal is output. Alternatively, two thresholds (the first threshold is greater than the second threshold) and three notification signals are set. If the probability value is less than the second threshold, the first notification signal is output; if the probability value is in the range between the first threshold and the second threshold, the second notification signal is output; if the probability value is greater than the first threshold, the third notification signal is output.

For example, assuming that the first classification label is "1" and the second classification label is "0", the higher the probability value, the closer the corresponding sound signal is to the first classification label. It may be set to: in response to the probability value being greater than the first threshold, a notification signal indicating that the sound signal conforms to the first classification label is output; in response to the probability value being greater than the second threshold and less than or equal to the first threshold, a notification signal indicating that the sound signal is close to the second classification label is output; in response to the probability value being less than or equal to the second threshold, a notification signal indicating that the sound signal conforms to the second classification label is output.

Figure 8:
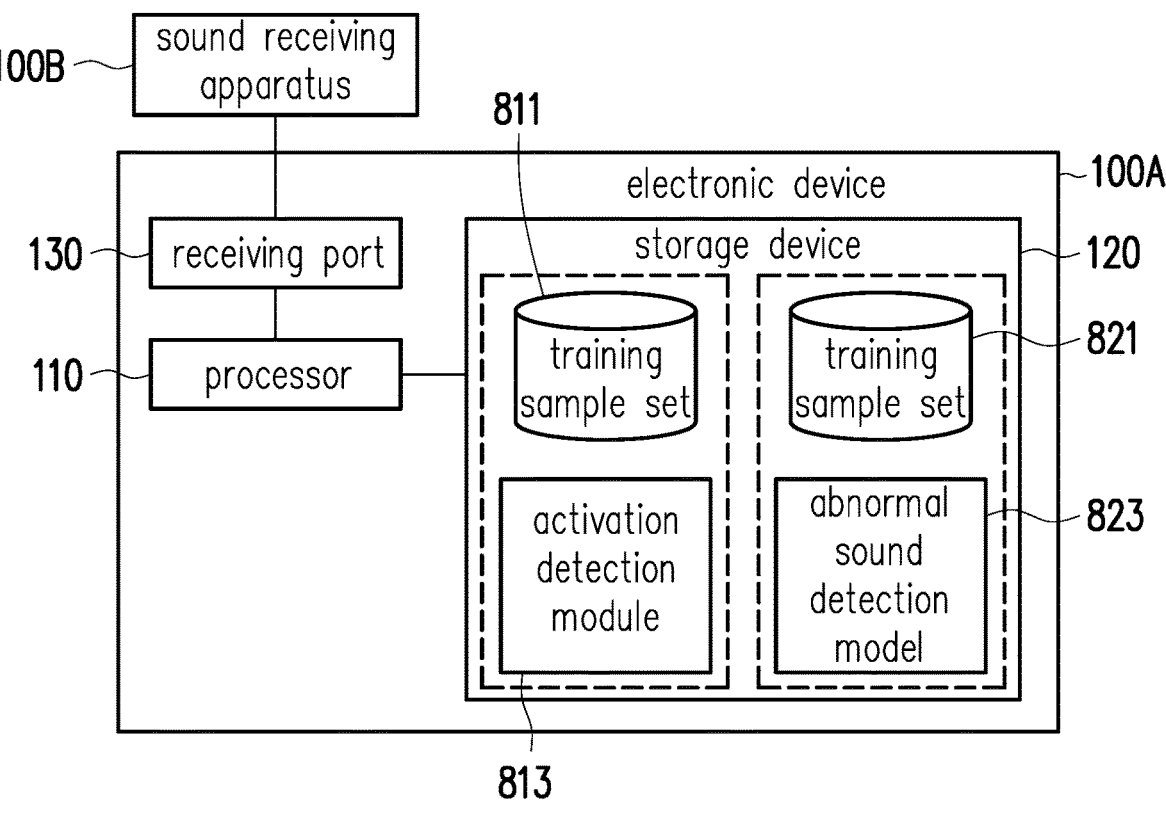
FIG. 8 is a block diagram of an abnormal sound detection system according to an embodiment of the present disclosure.

FIG. 8 is a block diagram of an abnormal sound detection system according to an embodiment of the present disclosure. In this embodiment, based on the sample audio files collected when the device under test is started and the sample audio files collected when the device under test is turned off, the training sample set 811 is generated by using the above method of obtaining the training sample set 400. Moreover, based on the original audio files collected when the device under test is operating normally and the original audio files collected when the device under test is operating abnormally, the training sample set 821 is generated by using the above method of obtaining the training sample set 400.

The processor 110 trains the activation detection module 813 and the abnormal sound detection model 823 respectively in the same way of training the above-mentioned neural network model 124. Table 1 shows the variable design of the activation detection module 813 and the abnormal sound detection model 823. However, Table 1 is only one of the implementation and the disclosure is not limited thereto.

TABLE 1

|  | Activation detection module | Abnormal sound detection model |
| --- | --- | --- |
| The number of nodes in the input layer L1 | 1025 | 1028 |
| The number of nodes in the first hidden layer L2 | 2048 | 2048 |
| The number of nodes in the second hidden layer L3 | 2048 | 2048 |
| The number of nodes in the output layer L4 | 1 | 1 |
| Activation function σ1 | Sigmoid | ReLU |
| Activation function $\sigma_2$ | Sigmoid | ReLU |
| Activation function $\sigma_3$ | Sigmoid | Sigmoid |
| Optimizer | Adam | Adam |
| Learning rate | 0.0001 | 0.0001 |
| Batch size | 64 | 64 |
| Epoch | 100 | 100 |
| Loss function | Binary cross entropy | Binary cross entropy |

In the embodiment shown in Table 1, the activation functions σ1, σ2, and σ3 of the first hidden layer L2, the second hidden layer L3, and the output layer L4 of the activation detection module 813 all adopt the Sigmoid function. The excitation functions σ1 and σ2 of the first hidden layer L2, the second hidden layer L3, and the output layer L4 of the abnormal sound detection module 823 adopt a rectified linear unit (ReLU). The excitation function σ3 of the output layer L4 adopts the Sigmoid function.

Figure 9:
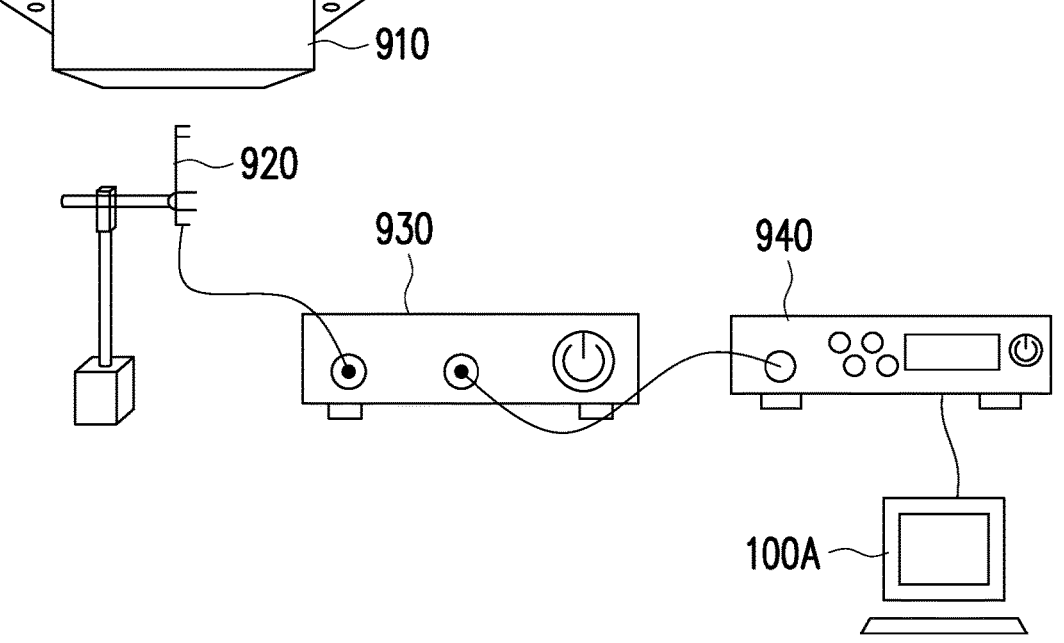
FIG. 9 is a schematic diagram of an abnormal sound detection system according to an embodiment of the present disclosure.

FIG. 9 is a schematic diagram of an abnormal sound detection system according to an embodiment of the present disclosure. In this embodiment, an ultrasonic cleaning machine 910 is used as a device under test, and a microphone (such as ultrasonic microphone) 920 is used as sound receiving apparatus. The microphone 920 is provided below the ultrasonic cleaning machine 910. In an embodiment, the distance between the microphone 920 and the ultrasonic cleaning machine 910 is between 1 centimeter and 20 centimeters, preferably between 2 centimeters and 5 centimeters. The sampling frequency of the microphone 920 is set between 20 kHz to 80 kHz, preferably between 20 kHz to 40 kHz.

In terms of hardware configuration, the microphone 920 is connected to the regulator 930, and the sound signal is transmitted to the electronic device 100A by the extractor 940. The sampling frequency of the extractor 940 is 96 kHz. In order to avoid aliasing effect on the signal, the sampling frequency of the microphone 920 is set to be less than half of the sampling frequency of the extractor 940.

If there are multiple ultrasonic cleaning machines, each ultrasonic cleaning machine will be equipped with a microphone for sound reception. And, these microphones may be set to receive sound simultaneously.

Figure 10:
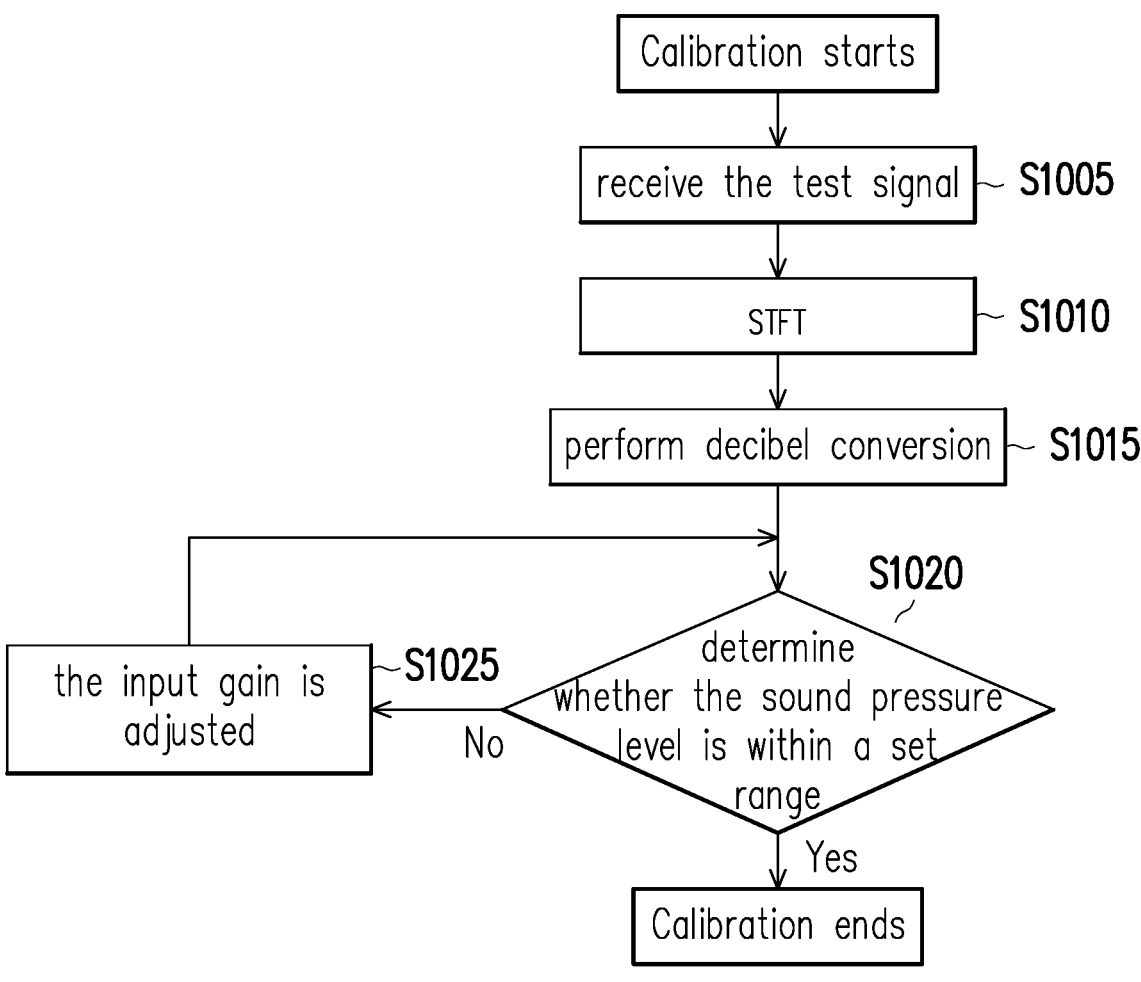
FIG. 10 is a flowchart of a calibration process of an abnormal sound detection system according to an embodiment of the present disclosure.

FIG. 10 is a flowchart of a calibration process of an abnormal sound detection system according to an embodiment of the present disclosure. Before performing abnormal sound detection, the microphone 920 is calibrated through the electronic device 100A as described below.

Referring to FIG. 9 and FIG. 10, in step S1005, the electronic device 100A receives the test signal from the microphone 920 through the extractor 940. Next, in step S1010, the electronic device 100A performs short-time Fourier transform (STFT) on the test signal to obtain a corresponding spectrogram. Afterwards, in step S1015, the electronic device 100A performs decibel conversion on the spectrogram to obtain a sound pressure signal. In step S1020, the electronic device 100A determines whether the sound pressure level of the sound pressure signal is within a set range. For example, the set range is between 94±1 db. If it is determined that the sound pressure level of the sound pressure signal is not within the set range, in step S1025, the input gain of the extractor 940 is adjusted until the sound pressure level of the sound pressure signal is within the set range, only then the calibration process ends. For example, the input gain of the extractor 940 may be automatically adjusted through the electronic device 100A. In addition, the input gain of the extractor 940 may also be adjusted manually.

Figure 11:
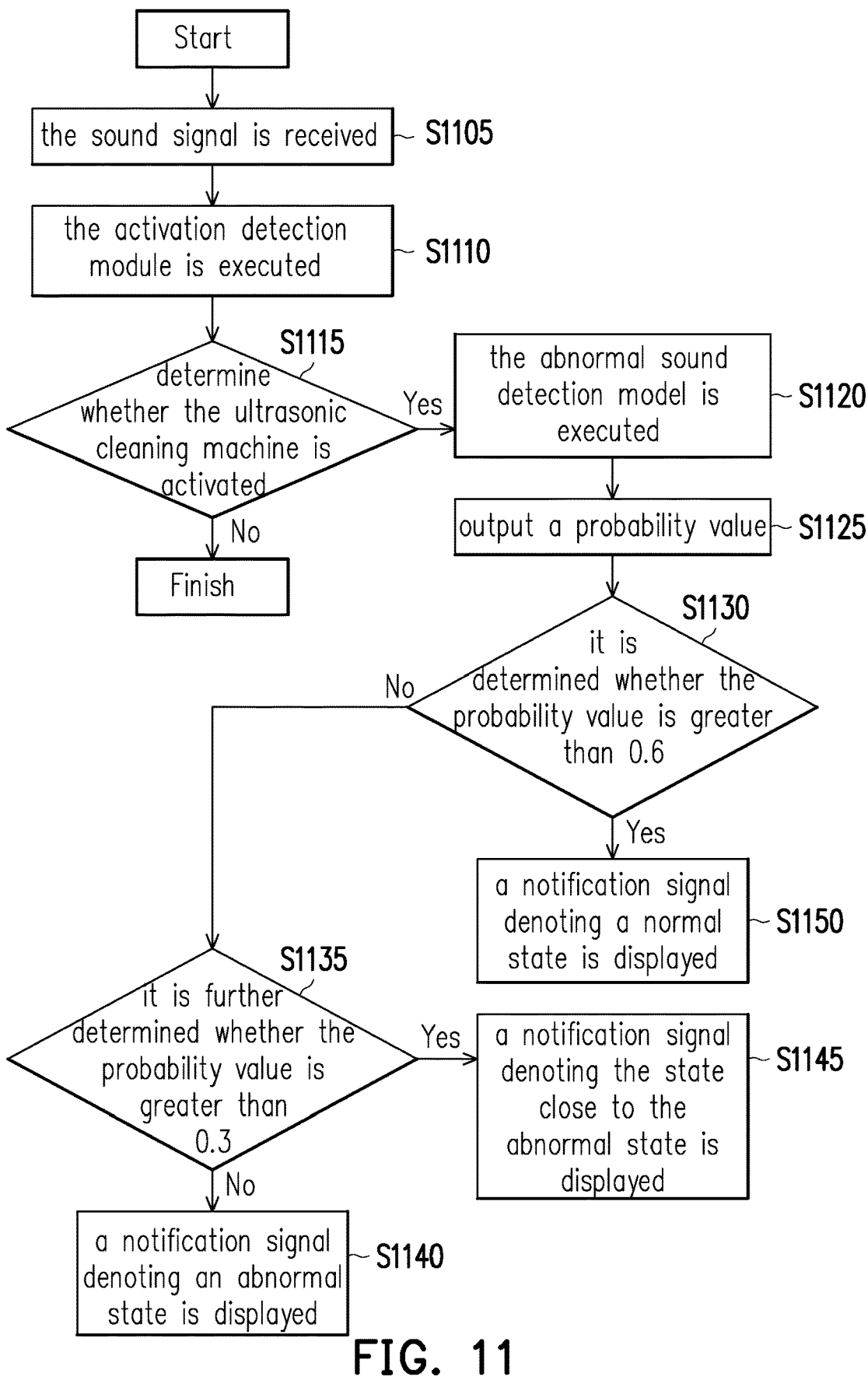
FIG. 11 is a flowchart of an application example of signal processing according to an embodiment of the present disclosure.

FIG. 11 is a flowchart of an application example of signal processing according to an embodiment of the present disclosure. This embodiment is an application example based on the embodiment shown in FIG. 2. Since the ultrasonic cleansing machine 910 is not always in the activated state, it is necessary to combine signals (obtained by obtaining the training sample set 400) to train the activation detection module 813 to determine whether the ultrasonic cleansing machine 910 is close to the activated state or the off state (the activation detection module 813 is trained to determine the change between the activation/off state). If the ultrasonic cleansing machine 910 is in the ON state, the abnormal sound detection model 823 is adopted to perform abnormal sound detection subsequently; if the ultrasonic cleansing machine 910 is in the OFF state, no action will be taken.

In this embodiment, the activation detection module 813 and the abnormal sound detection model 823 shown in FIG. 8 are used to realize the implementation, and the specific description is as follows.

In step S1105, the sound signal is received by the extractor 940. Next, in step S1110, the activation detection module 813 is executed to determine whether the ultrasonic cleaning machine 910 is activated in step S1115. When it is determined that the ultrasonic cleaning machine 910 is in the activated state, in step S1120, the abnormal sound detection model 823 is executed. And, in step S1125, the abnormal sound detection model 823 outputs a probability value. In step S1130, it is determined whether the probability value is greater than 0.6. If the probability value is greater than 0.6, in step S1150, a notification signal denoting a normal state is displayed to inform the user that the current state of the ultrasonic cleaning machine 910 is normal.

If the probability value is not greater than 0.6, in step S1135, it is further determined whether the probability value is greater than 0.3. If the probability value is not greater than 0.3, in step S1140, a notification signal denoting an abnormal state is displayed to inform the user that the current state of the ultrasonic cleaning machine 910 is abnormal. If the probability value is greater than 0.3 (and less than 0.6), in step S1145, a notification signal denoting the state close to the abnormal state is displayed to inform the user that the current state of the ultrasonic cleaning machine 910 is close to the abnormal state.

To sum up, this disclosure uses the sample signals belonging to the first classification label and the second classification label in the training database to obtain a combined signal, thereby obtaining a sample signal (combined signal) changing between different states, so that the sample patterns are expanded. Accordingly, the prediction accuracy of the neural network model may be improved. In this disclosure, the neural network model is used to not only monitor the device under test in real time, but also solve the time-consuming issue of manual detection in conventional technology.

What is claimed is:

1. A signal processing method, adaptable to be executed by an electronic device including a processor and a storage device, and the method comprising:
   training, by the processor, a neural network model, wherein the neural network model comprises an input layer, a first hidden layer, a second hidden layer and an output layer, and the first hidden layer, the second hidden layer and the output layer respectively have individual activation functions;
   receiving, by the processor, a sound signal from a sound receiving apparatus;
   inputting, by the processor, the sound signal into the trained neural network model to output a probability value;
   determining, by the processor, whether the probability value is within one of a plurality of numerical ranges, wherein the plurality of numerical ranges correspond to a plurality of notification signals; and
   outputting, by the processor, a corresponding one of the notification signals based on one numerical range in which the probability value is located,
   wherein training the neural network model comprises:
      (a) randomly selecting a plurality of sample signals from a training database stored in the storage device to obtain a combined signal, wherein the training database comprises a first sample set belonging to a first classification label and a second sample set belonging to a second classification label, and the number of the selected sample signals conforms to a preset number;
      (b) repeating the step (a) for a plurality of times to obtain a plurality of combined signals; and
      (c) using the combined signals to train the neural network model.

2. The signal processing method according to claim 1, wherein the step (a) comprises:
   randomly selecting M first sample signals from the first sample set, wherein $0 \leq M \leq T$, T represents the preset number;
   randomly selecting (T−M) second sample signals from the second sample set; and
   combining the M first sample signals and the (T−M) second sample signals to obtain the combined signal.

3. The signal processing method according to claim 1, wherein training, by the processor, the neural network model further comprises:

performing a short-time Fourier transform (STFT) on a plurality of original audio files comprised in the first sample set and the second sample set respectively to obtain a plurality of spectrograms; and performing a decibel conversion on the spectrograms respectively to obtain the sample signals.

4. The signal processing method according to claim 1, further comprising:

performing a calibration process, by the processor, comprising:

receiving a test signal from the sound receiving apparatus through an extractor;

performing a STFT on the test signal to obtain a corresponding spectrogram;

performing a decibel conversion on the spectrogram to obtain a sound pressure signal;

determining whether a sound pressure level of the sound pressure signal is within a set range; and after determining that the sound pressure level of the sound pressure signal is not within the set range, an input gain of the extractor is adjusted until the sound pressure level of the sound pressure signal is within the set range.

5. The signal processing method according to claim 4, wherein the set range is between 94±1 db.

6. The signal processing method according to claim 1, wherein inputting, by the processor, the sound signal to the trained neural network model comprises:

dividing the sound signal into a plurality of sub-signals conforming to the preset number;

inputting the sub-signals into the trained neural network model respectively to obtain a plurality of output values; and calculating an average of the output values as the probability value.

7. The signal processing method according to claim 1, wherein a first numerical range, a second numerical range and a third numerical range are set based on a first threshold and a second threshold as the plurality of numerical ranges, the first threshold is greater than the second threshold, the first numerical range is a range greater than the first threshold value, the second numerical range is a range greater than the second threshold value and less than or equal to the first threshold value, the third numerical range is a range less than the second threshold value, outputting, by the processor, the corresponding notification signal based on one numerical range in which the probability value is located comprises:

comparing the probability value with the first threshold and the second threshold;

in response to the probability value being within the first numerical range, outputting a first notification signal indicating that the sound signal conforms to the first classification label;

in response to the probability value being within the second numerical range, outputting a second notification signal indicating that the sound signal is close to the second classification label; and in response to the probability value being within the third numerical range, outputting a third notification signal indicating that the sound signal conforms to the second classification label.

8. The signal processing method according to claim 1, further comprising:

training, by the processor, another neural network model through the steps (a) to (c) based on another training database, wherein the other training database comprises another first sample set belonging to another first classification label and another second sample set belonging to another second classification label, one of the neural network model and the other neural network model serves as an activation detection module, and the other one serves as an abnormal sound detection module;

the activation detection module is configured to determine whether a device under test is activated, and the abnormal sound detection module is configured to determine whether an operation of the device under test is abnormal.

9. The signal processing method according to claim 1, wherein in the case where the neural network model is configured to determine whether a device under test is activated, the activation functions of the first hidden layer, the second hidden layer and the output layer adopt a Sigmoid function, in the case where the neural network model is configured to determine whether an operation of the device under test is abnormal, the activation functions of the first hidden layer and the second hidden layer adopt a rectified linear unit (ReLU), and the activation function of the output layer adopts the Sigmoid function.

10. The signal processing method according to claim 1, wherein the sound receiving apparatus is disposed below a device under test, and a distance between the sound receiving apparatus and the device under test is between 1 centimeter and 20 centimeters, a sampling frequency of the sound receiving apparatus is set between 20 kHz and 80 kHz.

11. An abnormal sound detection system, comprising:

a sound receiving apparatus, which is disposed below a device under test for receiving a sound; and an electronic device, comprising:

a receiving port, configured to receive a sound signal from the sound receiving apparatus;

a storage device, storing a training database and a neural network model; and a processor, coupled to the receiving port and the storage device, and configured to:

train the neural network model, wherein the neural network model comprises an input layer, a first hidden layer, a second hidden layer, and an output layer, and the first hidden layer, the second hidden layer, and the output layer have individual activation functions respectively;

receive the sound signal;

input the sound signal into the trained neural network model to output a probability value;

determine whether the probability value is within one of a plurality of numerical ranges, wherein the plurality of numerical ranges correspond to a plurality of notification signals; and output a corresponding one of the notification signals based on one numerical range in which the probability value is located, wherein training the neural network model comprises:

(a) randomly selecting a plurality of sample signals from the training database to obtain a combined signal, wherein the training database comprises a first sample set belonging to a first classification label and a second sample set belonging to a second classification label, and the number of the selected sample signals conforms to a preset number;

(b) repeating the step (a) for a plurality of times to obtain a plurality of combined signals; and (c) using the combined signals to train the neural network model.

12. The abnormal sound detection system according to claim 11, wherein in the step (a), the processor is configured to:

randomly select M first sample signals from the first sample set, wherein $0 \le M \le T$, T represents the preset number;

randomly select (T−M) second sample signals from the second sample set; and combine the M first sample signals and the (T−M) second sample signals to obtain the combined signal.

13. The abnormal sound detection system according to claim 11, wherein in the process of training the neural network model, the processor is configured to:

perform a STFT on a plurality of original audio files comprised in the first sample set and the second sample set respectively to obtain a plurality of spectrograms; and perform a decibel conversion on the spectrograms respectively to obtain the sample signals.

14. The abnormal sound detection system according to claim 11, wherein the processor is configured to: perform a calibration process, comprising:

receiving a test signal from the sound receiving apparatus through an extractor;

performing a STFT on the test signal to obtain a corresponding spectrogram;

performing a decibel conversion on the spectrogram to obtain a sound pressure signal;

determining whether a sound pressure level of the sound pressure signal is within a set range; and after determining that the sound pressure level of the sound pressure signal is not within the set range, an input gain of the extractor is adjusted until the sound pressure level of the sound pressure signal is within the set range.

15. The abnormal sound detection system according to claim 14, wherein the set range is between 94±1 db.

16. The abnormal sound detection system according to claim 11, wherein the processor is configured to input the sound signal to the trained neural network model, comprising:

dividing the sound signal into a plurality of sub-signals conforming to the preset number;

inputting the sub-signals into the trained neural network model respectively to obtain a plurality of output values; and calculating an average of the output values as the probability value.

17. The abnormal sound detection system according to claim 11, wherein a first numerical range, a second numerical range and a third numerical range are set based on a first threshold and a second threshold as the plurality of numerical ranges, the first threshold is greater than the second threshold, the first numerical range is a range greater than the first threshold value, the second numerical range is a range greater than the second threshold value and less than or equal to the first threshold value, the third numerical range is a range less than the second threshold value, the processor is configured to:

comparing the probability value with the first threshold and the second threshold;

in response to the probability value being within the first numerical range, outputting a first notification signal indicating that the sound signal conforms to the first classification label;

in response to the probability value being within the second numerical range, outputting a second notification signal indicating that the sound signal is close to the second classification label; and in response to the probability value being within the third numerical range, outputting a third notification signal indicating that the sound signal conforms to the second classification label.

18. The abnormal sound detection system according to claim 11, wherein the storage device further comprises another training database and another neural network model, and the processor is configured to:

train another neural network model through the steps (a) to (c) based on another training database, wherein the other training database comprises another first sample set belonging to another first classification label and another second sample set belonging to another second classification label, one of the neural network model and the other neural network model serves as an activation detection module, and the other one serves as an abnormal sound detection module;

the activation detection module is configured to determine whether a device under test is activated, and the abnormal sound detection module is configured to determine whether an operation of the device under test is abnormal.

19. The abnormal sound detection system according to claim 11, wherein:

in the case where the neural network model is configured to determine whether a device under test is activated, the activation functions of the first hidden layer, the second hidden layer and the output layer adopt a Sigmoid function, in the case where the neural network model is configured to determine whether an operation of the device under test is abnormal, the activation functions of the first hidden layer and the second hidden layer adopt a rectified linear unit (ReLU), and the activation function of the output layer adopts the Sigmoid function.

20. The abnormal sound detection system according to claim 11, wherein a distance between the sound receiving apparatus and the device under test is between 1 centimeter and 20 centimeters, and a sampling frequency of the sound receiving apparatus is set between 20 kHz and 80 kHz.

* * * * *